United States Patent
Zhang et al.

(10) Patent No.: US 12,225,755 B2
(45) Date of Patent: Feb. 11, 2025

(54) DISPLAY PANEL AND DISPLAY DEVICE INCLUDING HEAT TRANSFERRING GUIDING LAYER

(71) Applicant: YUNGU (GU'AN) TECHNOLOGY CO., LTD., Hebei (CN)

(72) Inventors: Xuefeng Zhang, Kunshan (CN); Wenkai Chen, Kunshan (CN); Hui Wang, Kunshan (CN); Linlin Qiu, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 590 days.

(21) Appl. No.: 17/504,217

(22) Filed: Oct. 18, 2021

(65) Prior Publication Data
US 2022/0052294 A1    Feb. 17, 2022

Related U.S. Application Data

(63) Continuation of application No. PCT/CN2020/095210, filed on Jun. 9, 2020.

(30) Foreign Application Priority Data

Sep. 12, 2019 (CN) .......................... 201910865291.3

(51) Int. Cl.
*H10K 50/84* (2023.01)
*H10K 50/844* (2023.01)
*H10K 59/80* (2023.01)

(52) U.S. Cl.
CPC ......... *H10K 50/844* (2023.02); *H10K 59/873* (2023.02)

(58) Field of Classification Search
CPC .... H10K 50/844; H10K 50/87; H10K 50/824; H10K 59/12; H10K 59/00; H10K 59/88; H10K 59/872
See application file for complete search history.

(56) References Cited

U.S. PATENT DOCUMENTS

2007/0013293 A1* 1/2007 Cok ..................... H10K 50/858
                                                              313/506
2014/0183462 A1* 7/2014 Lee ..................... H10K 50/8445
                                                              257/40

(Continued)

FOREIGN PATENT DOCUMENTS

CN    102916037 A    2/2013
CN    103289160 A    9/2013

(Continued)

OTHER PUBLICATIONS

International Search Report and Written Opinion (International Application No. PCT/CN2020/095210) with English Translation, dated Sep. 16, 2020, 10 pages.
Chinese First Office Action 100191 (CN Application No. CN 201910865291.3) and Search Report with English Translation, dated Mar. 3, 2021, 11 pages.
Chinese Supplementary Search, dated Aug. 6, 2021, 2 pages.

*Primary Examiner* — Ida M Soward
(74) *Attorney, Agent, or Firm* — Quarles & Brady LLP

(57) ABSTRACT

The present disclosure provides a display panel including a display component, an encapsulation structure and a guiding layer. The display component includes an electrode layer. The encapsulation structure is stacked on the display component. The electrode layer is adjacent to the encapsulation structure. The guiding layer is disposed in or on the encapsulation structure, and the guiding layer is connected to the electrode layer of the display component, and the guiding layer is configured to transfer heat generated by the display component to outside when the display component is in a working process.

17 Claims, 3 Drawing Sheets

(56) References Cited

U.S. PATENT DOCUMENTS

| | | | |
|---|---|---|---|
| 2014/0252317 A1 | 9/2014 | Gupta et al. | |
| 2016/0079564 A1* | 3/2016 | Shim | H10K 50/8445 |
| | | | 257/40 |
| 2016/0254485 A1 | 9/2016 | Song | |
| 2016/0322601 A1* | 11/2016 | Lee | H10K 59/12 |
| 2016/0336528 A1* | 11/2016 | Lee | H10K 59/80515 |
| 2018/0069191 A1* | 3/2018 | Lee | H10K 59/80522 |
| 2018/0219056 A1 | 8/2018 | Han | |
| 2018/0301661 A1* | 10/2018 | Schicktanz | B32B 7/06 |
| 2018/0309088 A1* | 10/2018 | Gong | H10K 50/844 |
| 2019/0006618 A1* | 1/2019 | Sonoda | H10K 77/111 |
| 2019/0058024 A1* | 2/2019 | Zeng | H10K 50/824 |
| 2019/0074339 A1* | 3/2019 | Ma | H10K 59/878 |
| 2020/0073500 A1* | 3/2020 | Jeong | H10K 59/40 |
| 2020/0260604 A1 | 8/2020 | Zhang et al. | |

FOREIGN PATENT DOCUMENTS

| | | | | |
|---|---|---|---|---|
| CN | 104183785 A | | 12/2014 | |
| CN | 106848106 A | | 6/2017 | |
| CN | 107331789 A | * | 11/2017 | ......... H01L 27/3241 |
| CN | 107546251 A | | 1/2018 | |
| CN | 108962028 A | | 12/2018 | |
| CN | 106206673 B | | 3/2019 | |
| CN | 109817827 A | | 5/2019 | |
| CN | 110176550 A | | 8/2019 | |
| CN | 110534554 A | | 12/2019 | |

\* cited by examiner

DISPLAY PANEL AND DISPLAY DEVICE INCLUDING HEAT TRANSFERRING GUIDING LAYER

CROSS-REFERENCE TO RELATED APPLICATIONS

This application is a continuation of International Application PCT/CN2020/095210 filed on Jun. 9, 2020, which claims priority to Chinese Patent Application No. 201910865291.3, filed on Sep. 12, 2019, the contents of both applications are herein incorporated by reference in their entireties.

TECHNICAL FIELD

The present application relates to the field of display technology.

BACKGROUND

In recent years, display technology has been developing rapidly due to the increasing demand for display performance of display devices. The display panel of the display device can adopt different types of display components based on different display technologies.

Generally, the display component is a current-type component and thus can generate a lot of heat during the light-emitting period, which can reduce the service life of the display component, thus reducing the product life of the display panel.

SUMMARY

The exemplary embodiments in the present disclosure provide a display panel and a display device.

In a first aspect, the exemplary embodiments in the present disclosure provide a display panel. The display panel includes a display component, an encapsulation structure, and a guiding layer. The display component includes an electrode layer. The encapsulation structure is stacked on the display component. The electrode layer is adjacent to the encapsulation structure. The guiding layer is disposed in or on the encapsulation structure, and the guiding layer is connected to the electrode layer of the display component, and the guiding layer is configured to transfer heat generated by the display component to the outside when the display component is in a working process.

In a second aspect, the exemplary embodiments in the present disclosure provide a display device. The display device includes the display panel provided in the first aspect.

In the display panel provided in the exemplary embodiments in the present disclosure, the guiding layer is disposed in or on the encapsulation structure, and the guiding layer is in contact with the display component, so that the guiding layer can effectively transfer heat generated by the display component to outside when the display component is in a working process. Therefore, a reduction of the service life of the display component caused by inefficient heat dissipation can be avoided, and the service life of the display panel is prolonged. Moreover, due to the contact between the guiding layer and the electrode layer of the display component, electrical conductivity of the electrode layer can be increased, a resistance of the electrode layer can be reduced, and an IR-drop can be improved, so that a brightness uniformity of the display panel can be improved. The display device including the display panel provided in the exemplary embodiments in the present disclosure also has the above-described advantages.

DETAILED DESCRIPTION

The features and exemplary embodiments of various respects of the present disclosure will be described in detail below.

It should be noted that in the present disclosure, the ordinal terms such as "first" and "second" are merely used to differentiate an entity or operation from another entity or operation, and are not intended to indicate or imply relative importance or order relationship between these entities or operations, or to imply the number of entities or operations referred to.

It should be understood that the performing orders of the steps of the manufacturing method in the present disclosure are not strictly limited by the embodiments described below. The steps of the manufacturing method in the present disclosure can be performed and implemented in any possible orders as long as there is no contradiction between the steps. Moreover, at least some of the steps of the manufacturing method may include multiple sub-steps or stages, in which the multiple sub-steps or stages may not necessarily be completed at the same time but completed at different times, and may not necessarily be performed sequentially but performed alternately or by turns with other steps or sub-steps or at least part of stages.

A display component, as a current-type component, can generate a lot of heat during a light-emitting period, which can reduce the service life of the display component, thus reducing the product life of the display panel. Moreover, with the increasing size of the current display panel, a length of a leading wire is increasing, and the resistance of the leading wire is increasing, thereby increasing an IR-drop of a screen body and decreasing the brightness uniformity. Although a problem of uniformity of the IR-drop in the driving structure of the display panel can be solved by arranging a compensation circuit or adding at least one auxiliary wire, there is still no good method to solve the problem of uniformity of the IR-drop in the electrode of the display component.

The exemplary embodiments in the present disclosure provide a display panel including a display component and an encapsulation structure. The display component can be an organic light-emitting diode (OLED) display component, a micro light-emitting diode (Micro-LED) display component, and so on. In the exemplary embodiments in the present disclosure, a guiding layer is provided to effectively solve a problem of heat dissipation of the display panel and a problem of uniformity of the IR-drop of the electrode. The exemplary embodiments in the present disclosure will be described in detail below with reference to the accompanying drawings.

Figure 1:
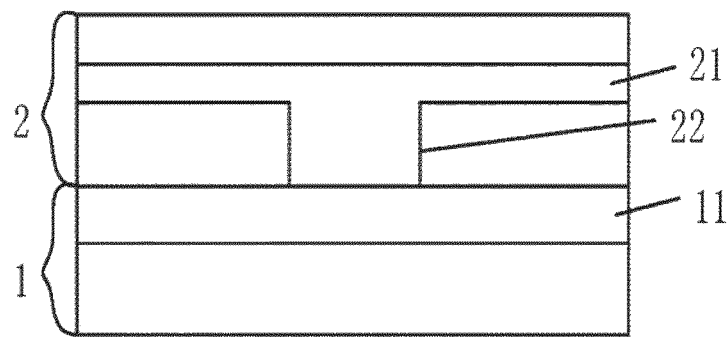
FIG. 1 is a schematic side view of a display panel provided in a first embodiment in the present disclosure.

Referring to FIG. 1, a display panel in an embodiment includes a display component 1 and an encapsulation structure 2 stacked on the display component 1. Display component 1 can be an OLED display component and generally can include a first electrode, a light-emitting layer, and a second electrode which are stacked in sequence in a direction away from a driving structure of the display panel. The first electrode and the second electrode can be respectively an anode and a cathode. Generally, the anode is connected to the driving structure of the display panel. At least one functional layer, such as an electron injection layer, an electron transport layer, a hole blocking layer, an electron blocking layer, and a hole transport layer, can be disposed between the rust electrode and the light-emitting layer or between the second electrode and the light-emitting layer.

In this embodiment, as shown in FIG. 1, the display component 1 includes an electrode layer 11. The electrode layer 11 can be configured to be adjacent to the encapsulation structure 2. In an embodiment that the display component 1 is an OLED display component, the electrode layer 11 can be the second electrode which is the cathode. A guiding layer 21 is disposed in the encapsulation structure 2 and connected to the electrode layer 11 of the display component 1. The guiding layer 21 is configured to transfer heat from the display component 1 to the outside. In this way, the guiding layer 21 is in contact with the display component 1, for example, the guiding layer 21 is in contact with the electrode layer 11 of the display component 1, so that the heat generated by the display component 1 in a working process can first be transferred to the electrode layer 11 and then transferred from the electrode layer 11 to the guiding layer 21. The guiding layer 21 is in contact with at least one external leading wire, so that the heat can be further transferred to outside by the at least one external leading wire. The heat generated by the display component 1 in the working process can be effectively transferred to outside through the guiding layer 21, so that a reduction of service life of various functional materials in the display component 1 caused by an inefficient heat dissipation can be avoided, and service life of the display panel is prolonged.

Referring to FIG. 1 again, optionally, encapsulation structure 2 includes at least one connecting hole 22. The guiding layer 21 is in direct contact with the electrode layer 11 by extending through the at least one connecting hole 22. As shown in FIG. 1, the number of the at least one connecting hole 22 can be one, as long as the direct contact between the guiding layer 21 and the electrode layer 11 can be achieved. A sufficient contact between the guiding layer 21 and the electrode layer 11 is ensured by the direct contact between the guiding layer 21 and the electrode layer 11, thereby increasing the efficiency of heat conduction between the electrode layer 11 and the guiding layer 21. In this way, the heat generated by the display component 1 in the working process can be better transferred to the outside, so that the reduction of the service life of various functional materials in the display component 1 caused by the inefficient heat dissipation can be avoided, and the service life of the display panel is prolonged. Moreover, due to the contact between the guiding layer 21 and the electrode layer 11 of the display component 1, the electrical conductivity of the electrode layer 11 can be increased, the resistance of the electrode layer 11 can be reduced, and the IR-drop can be improved, so that the brightness uniformity of the display panel can be increased.

Figure 2:
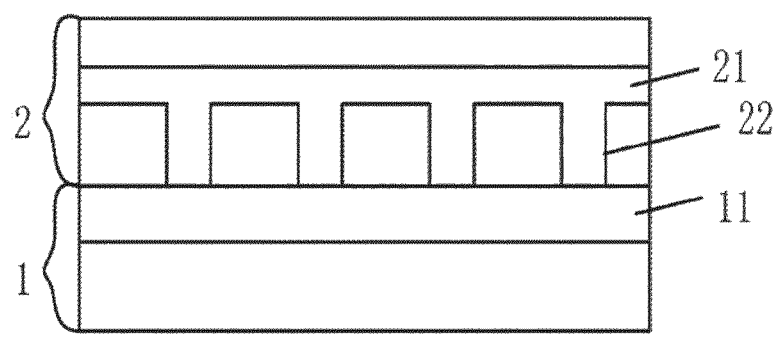
FIG. 2 is a schematic side view of a display panel provided in a second embodiment in the present disclosure, and the second embodiment includes a plurality of connecting holes provided in the first embodiment.

FIG. 2 is a schematic view of a display panel provided in a second embodiment in the present disclosure. Referring to FIG. 2, a plurality of connecting holes 22 can be defined in the encapsulation structure 2. The guiding layer 21 is in direct contact with the electrode layer 11 by extending through the plurality of connecting holes 22. The sufficient contact between the guiding layer 21 and the electrode layer 11 is ensured by the direct contact between the guiding layer 21 and the electrode layer 11, thereby increasing the efficiency of the heat conduction between the electrode layer 11 and the guiding layer 21. The advantage of defining the plurality of connecting holes 22 is that the contact area between the electrode layer 11 and the guiding layer 21 can be increased, so that the heat generated by the display component 1 in the working process can be better transferred to the outside, thus increasing the efficiency and rate of the heat conduction. Moreover, the plurality of connecting holes 22 can be dispersedly distributed, so that the contact positions between the electrode layer 11 and the guiding layer 21 can be dispersedly distributed. In this way, it can be avoided that the efficiency of heat conduction is affected by an accumulation of heat at a certain region due to excessive concentration of heat conduction. Furthermore, due to the contact between the guiding layer 21 and the electrode layer 11 of the display component 1, the electrical conductivity of the electrode layer 11 can be increased, the resistance of the electrode layer 11 can be reduced, and the IR-drop can be improved, so that the brightness uniformity of the display panel can be increased.

Optionally, the encapsulation structure 2 includes a plurality of connecting holes 22 arranged in an array. The contact positions between the guiding layer 21 and the electrode layer 11 are distributed more uniformly due to the plurality of connecting holes 22 arranged in an array, so that the heat generated by the display component 1 in the working process can be more uniformly transferred to the outside, and overheating in a certain region caused by an accumulation of heat at a certain region can be avoided.

Figure 3:
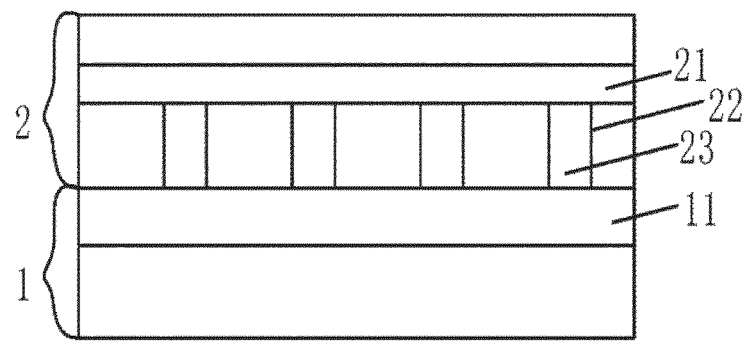
FIG. 3 is a schematic side view of a display panel provided in a third embodiment in the present disclosure, and the second embodiment includes at least one dispersed structure on the basis of the first embodiment.

FIG. 3 is a schematic view of a display panel in a third embodiment in the present disclosure. Referring to FIG. 3, the encapsulation structure 2 includes at least one connecting hole 22 and at least one dispersed structure 23 disposed in the at least one connecting hole 22. The guiding layer 21 is connected to the electrode layer 11 by the at least one dispersed structure 23. Compared to directly disposing the guiding layer 21 in the at least one connecting hole 22, in this embodiment, other materials can be disposed in the at least one connecting hole 22 to connect the guiding layer 21 with the electrode layer 11. The other materials can also transfer the heat generated by the display component 1 to the outside in the working process, so that the reduction of the service life of various functional materials in the display component 1 caused by the inefficient heat dissipation can be avoided, and the service life of the display panel is prolonged. Moreover, due to the contact between the guiding layer 21 and the electrode layer 11 of the display component 1 by the at least one dispersed structure 23, the electrical conductivity of the electrode layer 11 can be increased, the resistance of the electrode layer 11 can be reduced, and the IR-drop can be improved, so that the brightness uniformity of the display panel can be improved.

In this embodiment, optionally, a plurality of connecting holes 22 are defined in the encapsulation structure 2. The dispersed structures 23 disposed in some of the connecting holes 22 can be electrically conductive structures which are electrically connecting the guiding layer 21 with the electrode layer 11. In this way, the dispersed structures 23 can not only transfer the heat generated by the display component 1 to the outside in the working process, but also increase the electrical conductivity of the electrode layer 11, reduce the resistance of the electrode layer 11, and improve the IR-drop. In addition, the dispersed structures 23 disposed in the other connecting holes 22 can be stress dispersed structures. The strain resistance of the display panel can be increased by the stress dispersed structures disposed in the connecting holes 22. When the display panel is impacted by external force or bent, the external force can be dispersed via the stress dispersed structures in the connecting holes 22, so that the damage to the display panel caused by the external force can be effectively avoided, and thus the strength of the display panel is improved. Moreover, when the connecting holes 22 are arranged in an array, the effect of stress dispersion can be better achieved. It should be understood that the dispersed structure 23 can both be able to conduct electricity and disperse stress.

Optionally, the dispersed structures 23 include at least one electrically conductive structure which is electrically connecting the guiding layer 21 with the electrode layer 11 and at least one stress dispersed structure which is configured to disperse stress. A ratio of the number of the at least one electrically conductive structure to the number of the at least one stress dispersed structure can be between 3:1 and 1:3. In this way, the dispersed structures 23 can be effective in both electrical conduction and stress dispersion.

In a possible embodiment, in the above-described display panel provided in embodiments of the present disclosure, a material of the dispersed structure 23 includes at least one of polysiloxane, polyimide, polydimethylsiloxane, polymethacrylate, polystyrene, polycarbonate, indium tin oxide (ITO), indium gallium zinc oxide (IGZO), and indium zinc oxide (IZO). The above-described material is favorable to the heat conduction and the stress dispersion of the dispersed structure 23.

Figure 4:
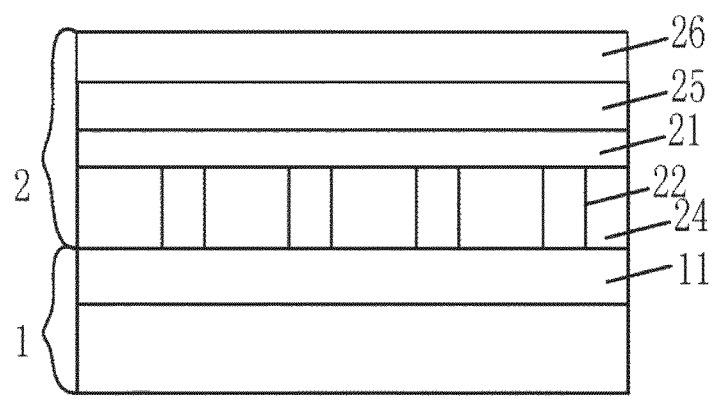
FIG. 4 is a schematic side view of a display panel provided in a fourth embodiment in the present disclosure.

The encapsulation structure 2 in the display panel can be achieved by a technique of thin film encapsulation. For example, the encapsulation structure 2 can include at least one inorganic layer and at least one organic layer alternately stacked with each other. Referring to FIG. 4, the encapsulation structure 2 can include a first inorganic layer 24, an organic layer 25, and a second inorganic layer 26 stacked in sequence with each other. The first inorganic layer 24 is disposed at a side of the electrode layer 11 facing to the encapsulation structure 2. The connecting holes 22 merely extend through the first inorganic layer 24. The guiding layer 21 is located between the first inorganic layer 24 and the organic layer 25. The guiding layer 21 can be connected to the electrode layer 11 by extending through the connecting holes 22, as shown in FIG. 2, or the guiding layer 21 can be connected to the electrode layer 11 by the dispersed structures 23 disposed in the connecting holes 22, as show in FIG. 3. On one hand, by disposing the guiding layer 21 between the first inorganic layer 24 and the organic layer 25 in the encapsulation structure 2 and making the guiding layer 21 be in contact with the electrode layer 11 of the display component 1, the heat generated by the display component 1 in the working process can be effectively transferred to the outside through the guiding layer 21, so that the reduction of the service life of various functional materials in the display component 1 caused by the inefficient heat dissipation can be avoided, and the service life of the display panel is prolonged. On the other hand, due to the contact between the guiding layer 21 and the electrode layer 11 of the display component 1, the electrical conductivity of the electrode layer 11 can be increased, the resistance of the electrode layer 11 can be reduced, and the IR-drop can be improved, so that the brightness uniformity of the display panel can be increased. Moreover, as the guiding layer 21 is disposed between the first inorganic layer 24 and the organic layer 25, the distance between the guiding layer 21 and the electrode layer 11 is relatively small, so that the connecting holes 22 have a relatively small length in their extending direction. Therefore, the connecting holes 22 can be made through a relatively simple process, which is favorable to a realization of the process.

Figure 5:
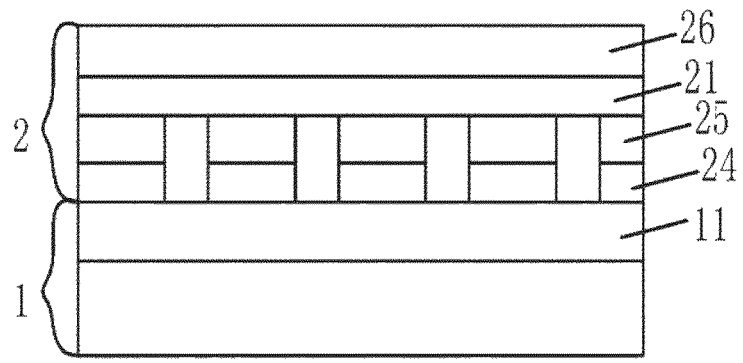
FIG. 5 is a schematic side view of a display panel provided in a fifth embodiment in the present disclosure, and an encapsulation structure of which is a variant of an encapsulation structure in the fourth embodiment.

In a fifth embodiment, as shown in FIG. 5, the guiding layer 21 can be located between the organic layer 25 and the second inorganic layer 26. The connecting holes 22 can extend through the first inorganic layer 24 and the organic layer 25, so that the guiding layer 21 can be connected to the electrode layer 11. It should be understood that in other optional embodiments, the number of the organic layers and the number of the inorganic layers in the encapsulation structure 2 can be set according to actual needs. Correspondingly, the guiding layer 21 can be disposed between any two layers of the encapsulation structure 2, and the connecting holes 22 extending through the layers between the guiding layer 21 and the electrode layer 11 is configured to connect the guiding layer 21 to the electrode layer 11. Optionally, the material of the inorganic layers in the encapsulation structure 2 includes at least one of SiNx, SiOx, and SiON.

In an optional embodiment, in the above-described display panel provided in the exemplary embodiments in the present disclosure, a thickness of the guiding layer 21 can be 100 nm to 300 nm. For example, the thickness of the guiding layer 21 can be 100 nm, 125 nm, 135 nm, 160 nm, 180 nm, 210 nm, 225 nm, 250 nm, 280 nm, or 300 nm. If the guiding layer 21 is too thick, it will be not conducive to reducing the overall thickness of the display panel. If the guiding layer 21 is too thin, it will affect the heat conduction and be not conducive to the heat dissipation of the display component 1. When the thickness of the guiding layer 21 is set as above, the heat generated by the display component 1 in the working process can be more effectively transferred to the outside, thereby increasing the service life of the display panel. Moreover, the electrical conductivity of the electrode layer 11 can be increased, the resistance of the electrode layer 11 can be reduced, the IR-drop can be improved, the brightness uniformity of the display panel can be increased, and the encapsulation effect will not be affected.

Figure 6:
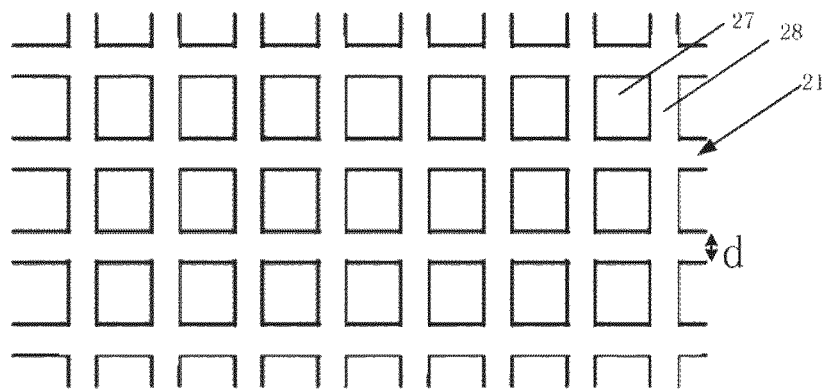
FIG. 6 is a schematic top view of a guiding layer provided in a sixth embodiment in the present disclosure.

FIG. 6 is a schematic top view of the guiding layer provided in an embodiment of the present disclosure. Referring to FIG. 6, a projection of the guiding layer 21 on a horizontal plane where the display component 1 is located in is shaped as a grid. The projection which is shaped as a grid includes a plurality of grid openings 27 defined by a plurality of gridlines 28. Each of the plurality of grid openings is aligned with a light-emitting region of the display component 1. Since the projection of the guiding layer 21 is shaped as a grid, the heat generated by the display component 1 in working process can be better transferred to the outside, thereby increasing the efficiency and rate of heat conduction. Therefore, it can be avoided that the heat conduction is concentrated in a certain area, thus avoiding an accumulation of heat at a certain region, thus avoiding affecting the effect of heat conduction. Moreover, since the grid opening 27 is aligned with the light-emitting region of the display component 1, the guiding layer 21 will not adversely affect the light emission of the display component 1. Based on this, the material of the guiding layer 21 can be a non-transparent material, thereby expanding the choosing range of the material of the guiding layer 21, which is beneficial to the process.

In an embodiment, a range of a width of the gridline 28 is 5 μm to 20 μm. As shown in FIG. 6, the width of the gridline 28 refers to a width d of each of the plurality of gridlines forming the grid in the guiding layer 21. For example, the width of the gridline 28 can be 5 μm, 8 μm, 12 μm, 15 μm, 17 μm, or 20 μm. If the width of the gridline 28 is too small, it is unfavorable to decrease the resistance of the electrode layer 11. If the width of the gridline 28 is too large and the guiding layer 21 is made of a non-transparent material, the gridline 28 will adversely affect the light emission of the display component 1. By adopting the gridline 28 in this embodiment, on one hand, the heat generated by the display component 1 in the working process can be effectively transferred to the outside, thereby increasing the service life of the display panel. On the other hand, the electrical conductivity of the electrode layer 11 can be increased, the resistance of the electrode layer 11 can be reduced, the IR-drop can be improved, and the brightness uniformity of the display panel can be increased.

Optionally, in the above-described display panel provided in the embodiments of the present disclosure, the material of the guiding layer 21 includes metal or electrically conductive oxide, the electrically conductive oxide may be transparent. Various types of materials can be selected. Optionally, the metal material of the guiding layer 21 can be a layer of Ti—Al—Ti. The electrically conductive oxide of the guiding layer 21 concludes at least one of indium tin oxide (ITO), indium gallium zinc oxide (IGZO), and indium zinc oxide (IZO). Better heat conduction can be achieved by using the above-described materials. Moreover, the electrical conductivity of the electrode layer 11 can be increased, the resistance of the electrode layer 11 can be reduced, the IR-drop can be improved, and the brightness uniformity of the display panel can be increased.

Optionally, in the display panel provided in embodiments of the present disclosure, the guiding layer 21 can be disposed on the encapsulation structure 2. The connection manner between the guiding layer 21 and the electrode layer 11 can be referred to the manner described in the above embodiments, as long as the guiding layer 21 is in contact with the electrode layer 11, and the connection manner between the guiding layer 21 and the electrode layer 11 will not be repeated again herein. In this embodiment, the same effect can be achieved as the aforementioned embodiments, and the effect will not be repeated again. Optionally, when the guiding layer 21 is located on the encapsulation structure 2, since a touch-control structure is often disposed on the encapsulation structure 2, one layer in the touch-control structure can be used as the guiding layer 21, there is no need to provide an additional guiding layer 21. In this way, the same effect as the aforementioned embodiments can also be achieved.

Furthermore, in the above-described embodiments, as long as it does not affect the light emission of the display device, the materials and the setting manners of the guiding layer 21, the connecting holes 22, and the dispersed structures 23 can be arbitrarily combined and will not be repeated again herein. In the aforementioned embodiments, the cross-sections of the connecting holes 22 can have various shapes such as circle or rectangle.

Figure 7:
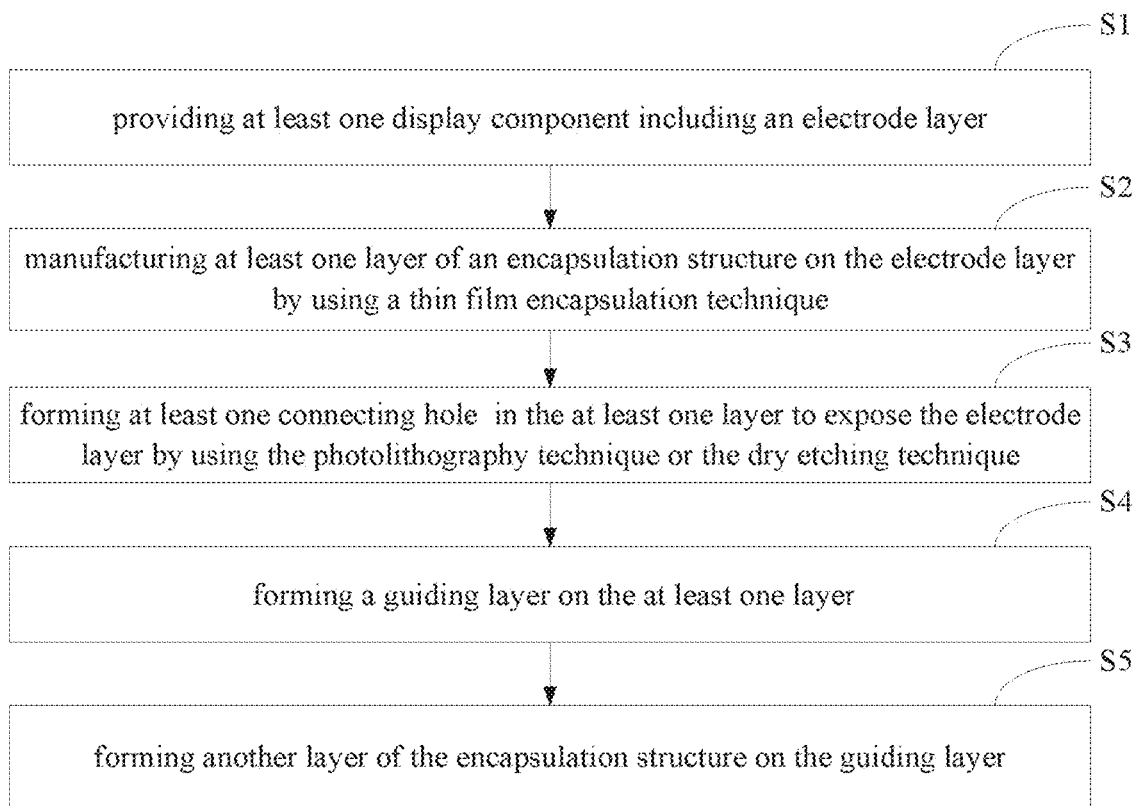
FIG. 7 is a flow chart of a manufacturing method of the display panel provided in embodiments in the present disclosure.

The exemplary embodiments of the present disclosure further provide a manufacturing method of the display panel, as shown in FIG. 7. Referring to FIG. 1 and FIG. 7, in an embodiment, taking an example of setting the guiding layer 21 in the encapsulation structure 2, the manufacturing method includes the following steps.

Step S1, providing the display component 1, and the display component 1 including the electrode layer 11.

The provided display component 1 has been previously manufactured.

Step S2, manufacturing at least one layer of the encapsulation structure 2 on the electrode layer 11 by using a technique of thin-film encapsulation.

In an embodiment, the technique of thin-film encapsulation for manufacturing the encapsulation structure 2 is a chemical vapor deposition (CVD).

Step S3, forming at least one connecting hole 22 in the at least one layer of the encapsulation structure 2 to expose the electrode layer 11 by using a photolithography technique or a dry etching technique.

Step S4, forming the guiding layer 21 on the at least one layer of the encapsulation structure 2.

In an embodiment, the guiding layer 21 is connected to the electrode layer 11 of the display component 1 by extending through the at least one connecting hole 22. In another embodiment, a step of forming at least one dispersed structure 23 in the at least one connecting hole is further provided between the step S3 and the step S4, so that the guiding layer 21 is connected to the electrode layer 11 of the display component 1 by the at least one dispersed structure 23.

Optionally, the above-described manufacturing method can further include step S5.

Step S5, forming another layer of the encapsulation structure 2 on the guiding layer 21.

The above-described manufacturing method is only one of the methods for achieving the display panel provided in the embodiments of the present disclosure. It should be understood that the display panel of the present disclosure can also be achieved by other manufacturing methods.

In the display panel provided in the exemplary embodiments in the present disclosure, the guiding layer 21 is disposed in or on the encapsulation structure 2, and the guiding layer 21 is in contact with the display component 1, so that the heat generated by the display component 1 in the working process can be effectively transferred to the outside. Therefore, the reduction of the service life of the display component caused by the inefficient heat dissipation can be avoided, and the service life of the display panel is prolonged. Moreover, due to the contact between the guiding layer 21 and the electrode layer 11 of the display component 1, the electrical conductivity of the electrode layer 11 can be increased, the resistance of the electrode layer can be reduced, and the IR-drop can be improved, so that the brightness uniformity of the display panel can be increased.

The exemplary embodiments in the present disclosure further provide a display device including the above-described display panel. The display device can be applied to any products or assemblies having displaying functions, such as virtual display devices, mobile phones, tablets, televisions, displayers, laptops, digital photo frames, navigators, wearable watches, IoT nodes, and so on. Since a principle of solving a problem for the display device is similar to that for the above-described display panel, an implementation of the display device can refer to an implementation of the above-described display panel, and the display device has the same advantages as that of the above-described display panel, which will not be repeated herein.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present application.

What is claimed is:

1. A display panel comprising:
   a display component comprising an electrode layer;
   an encapsulation structure stacked on the display component and adjacent to the electrode layer; and
   a guiding layer disposed in or on the encapsulation structure, the guiding layer being connected to the electrode layer of the display component, and the guiding layer being configured to transfer heat generated by the display component to the outside when the display component is in a working process;
   wherein at least one connecting hole is defined in the encapsulation structure, and the guiding layer is in direct contact with the electrode layer by extending in and through the at least one connecting hole.

2. The display panel of claim 1, wherein at least one connecting hole is defined in the encapsulation structure, and the encapsulation structure comprises at least one dispersed structure disposed in the at least one connecting hole, and the guiding layer is connected to the electrode layer by the at least one dispersed structure.

3. The display panel of claim 2, wherein the dispersed structure comprises at least one electrically conductive structure configured to electrically connect the guiding layer with the electrode layer and at least one stress dispersed structure configured to disperse stress; or the dispersed structure only comprises at least one electrically conductive structure which is electrically connecting the guiding layer with the electrode layer; or the dispersed structure only comprises at least one stress dispersed structure which is configured to disperse stress.

4. The display panel of claim 3, wherein the dispersed structure comprises the at least one electrically conductive structure and the at least one stress dispersed structure, and a ratio of a number of the at least one electrically conductive structure to a number of the at least one stress dispersed structure is between 3:1 and 1:3.

5. The display panel of claim 1, wherein a material of the dispersed structure comprises at least one of polysiloxane, polyimide, polydimethylsiloxane, polymethacrylate, polystyrene, polycarbonate, indium tin oxide, indium gallium zinc oxide, and indium zinc oxide.

6. The display panel of claim 1, wherein a plurality of connecting holes arranged in an array are defined in the encapsulation structure.

7. The display panel of claim 1, wherein a projection of the guiding layer on a horizontal plane where the display component is located in is shaped as a grid, and the projection which is shaped as a grid comprises a plurality of grid openings defined by a plurality of gridlines, and each of the plurality of grid openings is aligned with a light-emitting region of the display component.

8. The display panel of claim 7, wherein a range of a width of each of the plurality of gridlines is 5 μm to 20 μm.

9. The display panel of claim 1, wherein a material of the guiding layer is a non-transparent material.

10. The display panel of claim 1, wherein the encapsulation structure further comprises at least one layer, and the guiding layer is disposed between the display component and one layer of the at least one layer of the encapsulation structure.

11. The display panel of claim 10, wherein the at least one layer of the encapsulation structure comprises a first inorganic layer, an organic layer and a second inorganic layer, and the first inorganic layer is adjacent to the electrode layer, and the guiding layer is located between the first inorganic layer and the organic layer, and the second inorganic layer is disposed at a side of the organic layer facing away from the guiding layer.

12. The display panel of claim 10, wherein the at least one layer of the encapsulation structure comprises a first inorganic layer, an organic layer and a second inorganic layer, and the first inorganic layer is adjacent to a side of the electrode layer facing to the encapsulation structure, and the guiding layer is disposed between the organic layer and the second inorganic layer.

13. The display panel of claim 1, wherein a material of the guiding layer comprises a metal or an electrically conductive oxide.

14. The display panel of claim 13, wherein the metal is a layer of Ti—Al—Ti, and the electrically conductive oxide comprises at least one of indium tin oxide, indium gallium zinc oxide, and indium zinc oxide.

15. The display panel of claim 1, wherein a range of a thickness of the guiding layer is 100 nm to 300 nm.

16. A display device, comprising the display panel of claim 1.

17. A display panel comprising:
   a display component comprising an electrode layer;
   an encapsulation structure stacked on the display component and adjacent to the electrode layer; and
   a guiding layer disposed in or on the encapsulation structure, the guiding layer being connected to the electrode layer of the display component, and the guiding layer being configured to transfer heat generated by the display component to the outside when the display component is in a working process;
   wherein the encapsulation structure further comprises at least one layer, and the guiding layer is disposed between the display component and one layer of the at least one layer of the encapsulation structure; and
   the at least one layer of the encapsulation structure comprises a first inorganic layer, an organic layer and a second inorganic layer, and the first inorganic layer is adjacent to the electrode layer, and the guiding layer is located between the first inorganic layer and the organic layer, and the second inorganic layer is disposed at a side of the organic layer facing away from the guiding layer; or
   the at least one layer of the encapsulation structure comprises a first inorganic layer, an organic layer and a second inorganic layer, and the first inorganic layer is adjacent to a side of the electrode layer facing to the encapsulation structure, and the guiding layer is disposed between the organic layer and the second inorganic layer.

* * * * *